(12) United States Patent
Kim et al.

(10) Patent No.: US 8,530,893 B2
(45) Date of Patent: Sep. 10, 2013

(54) DISPLAY SUBSTRATE AND METHOD OF MANUFACTURING THE SAME

(75) Inventors: Ki-Won Kim, Suwon-si (KR);
Kyoung-Jae Chung, Seoul (KR);
Hye-Young Ryu, Seoul (KR);
Young-Joo Choi, Yongin-si (KR);
Seung-Ha Choi, Suwon-si (KR);
Kap-Soo Yoon, Seoul (KR)

(73) Assignee: Samsung Display Co., Ltd., Yongin (KR)

( * ) Notice: Subject to any disclaimer, the term of this patent is extended or adjusted under 35 U.S.C. 154(b) by 32 days.

(21) Appl. No.: 13/205,132

(22) Filed: Aug. 8, 2011

(65) Prior Publication Data

US 2012/0037911 A1   Feb. 16, 2012

(30) Foreign Application Priority Data

Aug. 10, 2010  (KR) .................. 10-2010-0076906

(51) Int. Cl.
*H01L 29/786*  (2006.01)
*H01L 29/10*  (2006.01)
*H01L 21/34*  (2006.01)

(52) U.S. Cl.
USPC ............. 257/43; 257/57; 257/59; 257/76; 257/78; 257/E21.456; 257/E21.461; 257/E29.273; 257/E29.296; 257/E33.012; 438/34; 438/104; 438/149

(58) Field of Classification Search
USPC .................. 257/43, 57, 59, 76, 78, E21.459, 257/E21.461, E29.273, E29.296, E33.012; 438/34, 104, 149
See application file for complete search history.

(56) References Cited

U.S. PATENT DOCUMENTS

| | | | |
|---|---|---|---|
| 8,294,148 B2 * | 10/2012 | Ye ................................. | 257/43 |
| 2010/0244020 A1 * | 9/2010 | Sakata et al. ................. | 257/43 |
| 2011/0175082 A1 * | 7/2011 | Kim et al. ..................... | 257/43 |

* cited by examiner

*Primary Examiner* — Dao H Nguyen
(74) *Attorney, Agent, or Firm* — H.C. Park & Associates, PLC

(57) ABSTRACT

A display substrate includes a gate wire formed on an insulating substrate, a semiconductor pattern formed on the gate wire and containing a metal oxynitride compound, and a data wire formed on the semiconductor pattern to cross the gate wire. The semiconductor pattern has a carrier number density ranging from $10^{16}/cm^3$ to $10^{19}/cm^3$.

22 Claims, 13 Drawing Sheets

DISPLAY SUBSTRATE AND METHOD OF MANUFACTURING THE SAME

CROSS REFERENCE TO RELATED APPLICATION

This application claims priority from and the benefit of Korean Patent Application No. 10-2010-0076906, filed on Aug. 10, 2010, which is hereby incorporated by reference for all purposes as if fully set forth herein.

BACKGROUND OF THE INVENTION

1. Field of the Invention

Exemplary embodiments of the present invention relate to a display substrate and a method of manufacturing the same.

2. Discussion of the Background

A large-sized and high-quality display device is in demand. A liquid crystal display is an example of such a display device, and positive improvements of the operating characteristics of its thin film transistor for driving its liquid crystal layer might be beneficial. In a conventional thin film transistor, hydrogenated amorphous silicon (a-Si:H) may be used as a semiconductor pattern for forming the channel of a thin film transistor. However, hydrogenated amorphous silicon may have low electron mobility, which decreases favorable switching characteristics of the thin film transistor.

A method for forming a semiconductor pattern with high electron mobility is therefore desired.

SUMMARY OF THE INVENTION

Exemplary embodiments of the present invention provide a display substrate including a thin film transistor having stability and reliability.

Exemplary embodiments of the present invention also provide a method of manufacturing a display substrate including a thin film transistor having stability and reliability.

Additional features of the invention will be set forth in the description which follows and, in part, will be apparent from the description or may be learned by practice of the invention.

An exemplary embodiment of the present invention discloses a display substrate that comprises a gate wire disposed on a substrate; a semiconductor pattern disposed on the gate wire and comprising a metal oxynitride and one of a heat treated semiconductor or a plasma treated semiconductor; and a data wire disposed on the semiconductor pattern and crossing the gate wire.

An exemplary embodiment of the present invention also discloses a method of manufacturing a display substrate. The method comprises forming a gate wire on a substrate; forming a semiconductor comprising a metal oxynitride on the gate wire; performing a heat treatment or a plasma treatment on the semiconductor; and forming a data wire on the semiconductor, the date wire crossing the gate wire.

An exemplary embodiment of the present invention additionally discloses a microelectronic switch that comprises a gate electrode; a drain electrode and a source electrode disposed corresponding to the gate electrode; a semiconductor disposed between the gate electrode and the drain electrode and the source electrode. The semiconductor comprises a metal oxynitride having a carrier number density such that the semiconductor has a sheet resistance ranging from $10^5$ $\Omega$/sq to $10^7$ $\Omega$/sq and an electron mobility greater than or equal to 10 $cm^2$/V·s.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and, together with the description, serve to explain the principles of the invention.

DETAILED DESCRIPTION OF THE ILLUSTRATED EMBODIMENTS

Figure 1:
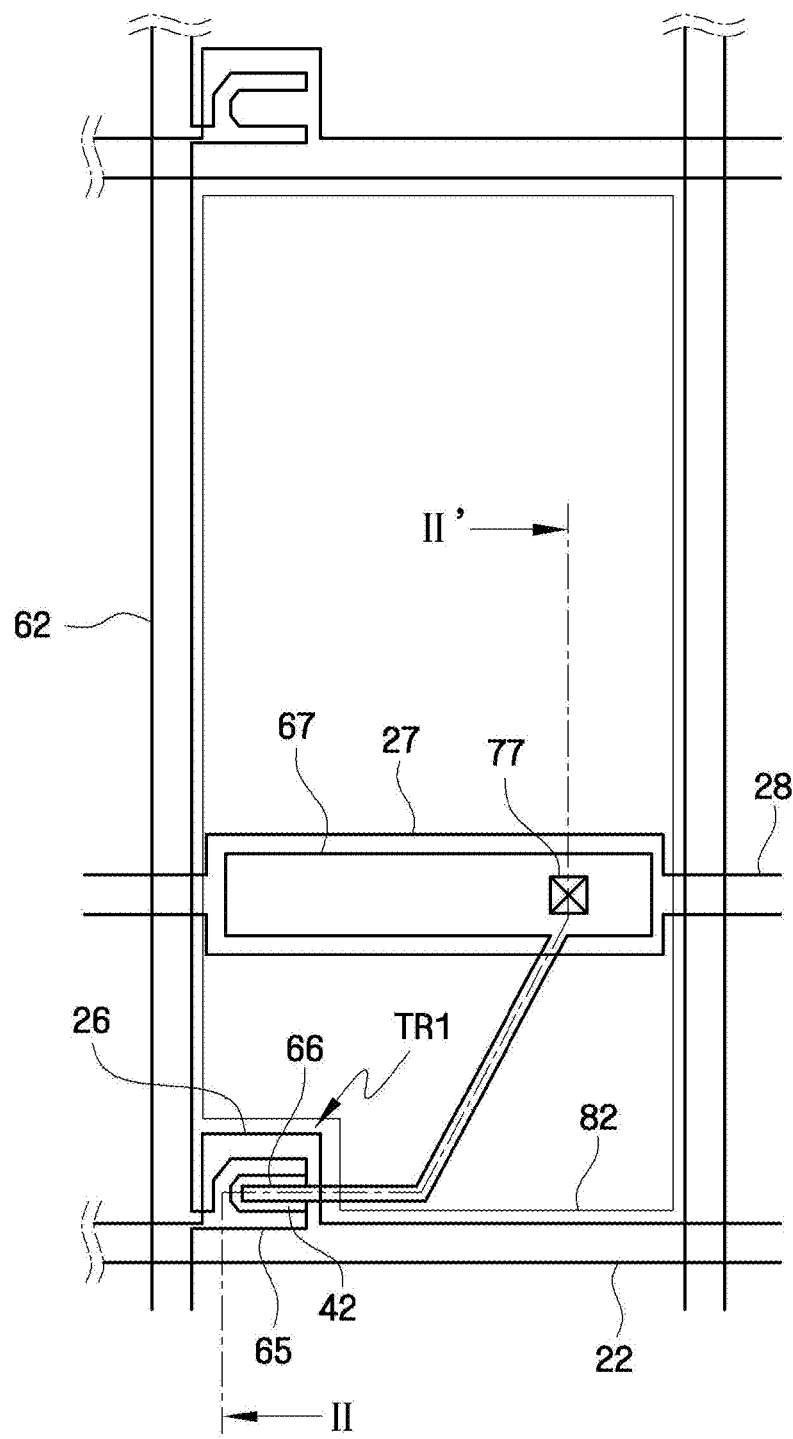
FIG. 1 is a layout of a display substrate according to an exemplary embodiment of the present invention.

Advantages and features of the present invention and methods of accomplishing the same may be understood more readily by reference to the following detailed description of exemplary embodiments and the accompanying drawings. The present invention may, however, be embodied in many different forms and should not be construed as being limited to the exemplary embodiments set forth herein. Rather, these exemplary embodiments are provided so that this disclosure will be thorough and complete and will convey concepts of the invention to those skilled in the art. In the drawings, sizes and relative sizes of layers and regions may be exaggerated for clarity.

The invention is described more fully hereinafter with reference to the accompanying drawings in which exemplary embodiments of the invention are shown. This invention may, however, be embodied in many different forms and should not be construed as limited to the exemplary embodiments set forth herein. Rather, these exemplary embodiments are provided so that this disclosure is thorough and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on," "connected to," or "coupled to" another element or layer, it can be directly on, directly connected to, directly coupled to the other element or layer, or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items.

Spatially relative terms, such as "below", "beneath", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. Throughout the specification, like reference numerals in the drawings denote like elements.

Exemplary embodiments of the present invention are described herein with reference to cross-sectional illustrations that are schematic illustrations of idealized exemplary embodiments of the present invention. As such, variations from the shapes of the illustrations as a result, for example, of manufacturing techniques and/or tolerances, are to be expected. Thus, exemplary embodiments of the present invention should not be construed as limited to the particular shapes of regions illustrated herein but are to include deviations in shapes that result, for example, from manufacturing. Thus, the regions shown in the figures are schematic in nature, and their shapes are not intended to illustrate the precise shape of a region and are not intended to limit the scope of the present invention.

Unless otherwise defined, all terms (including technical and scientific terms) used herein have a meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a display substrate, a display device, and a method of manufacturing the display substrate and device according to exemplary embodiments of the present invention are described with reference to the accompanying drawings.

First, a display substrate and a display device according to an exemplary embodiment of the present invention are described with reference to FIG. 1, FIG. 2, FIG. 4, FIG. 6, and FIG. 8.

Figure 2:
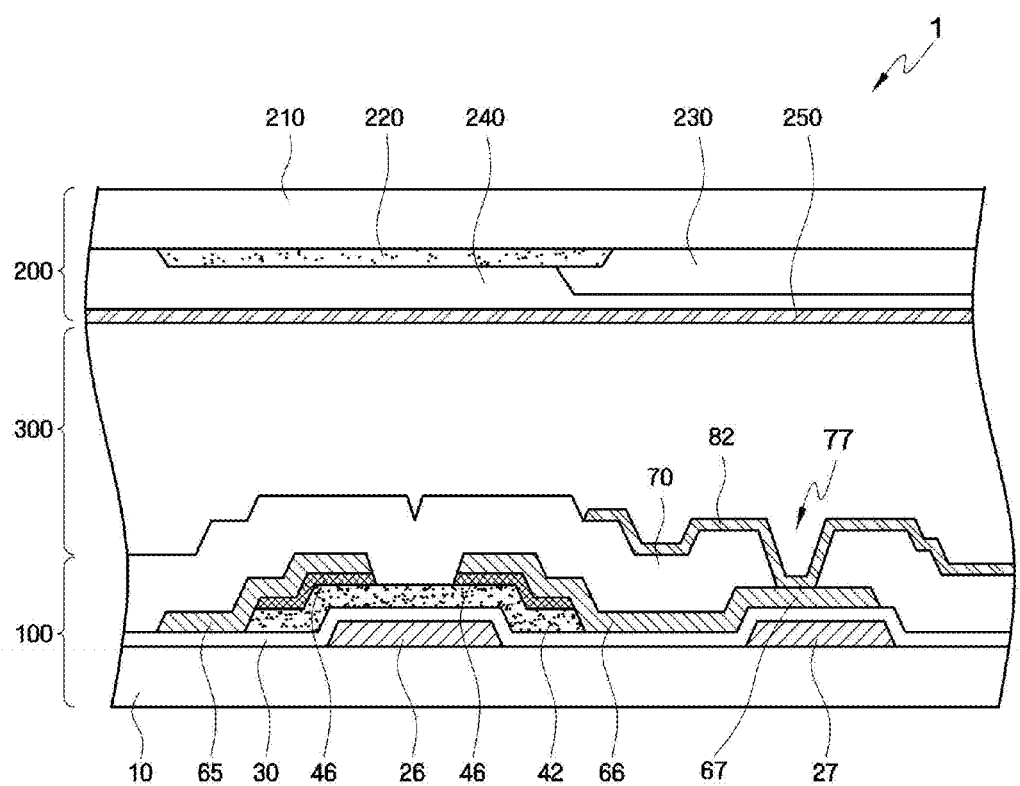
FIG. 2 is a cross-sectional view of a display device taken along line II-II' of FIG. 1.
Figure 3:
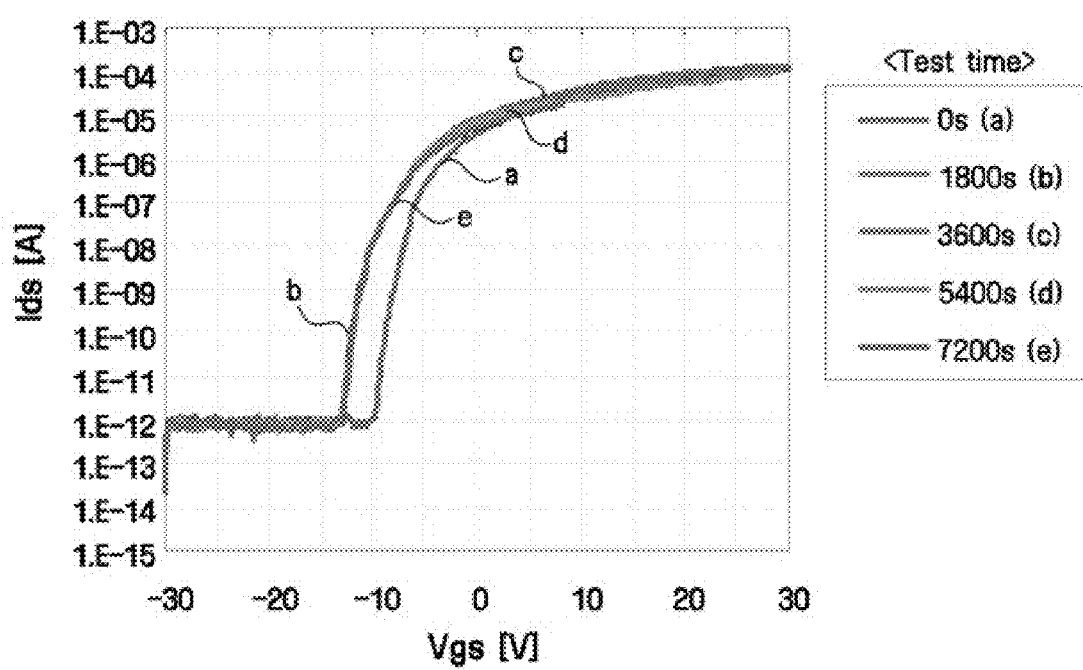
FIG. 3, FIG. 5, and FIG. 7 are graphs of characteristics of a thin film transistor in a comparative example of a display device.
Figure 4:
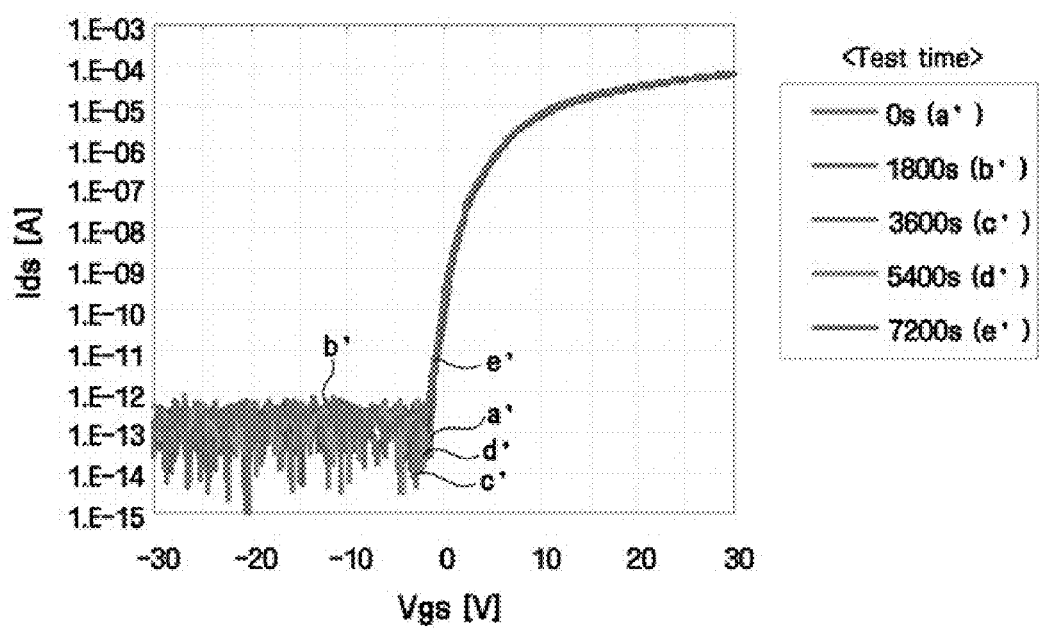
FIG. 4, FIG. 6, and FIG. 8 are graphs of characteristics of a thin film transistor of a display substrate according to an exemplary embodiment of the present invention.
Figure 5:
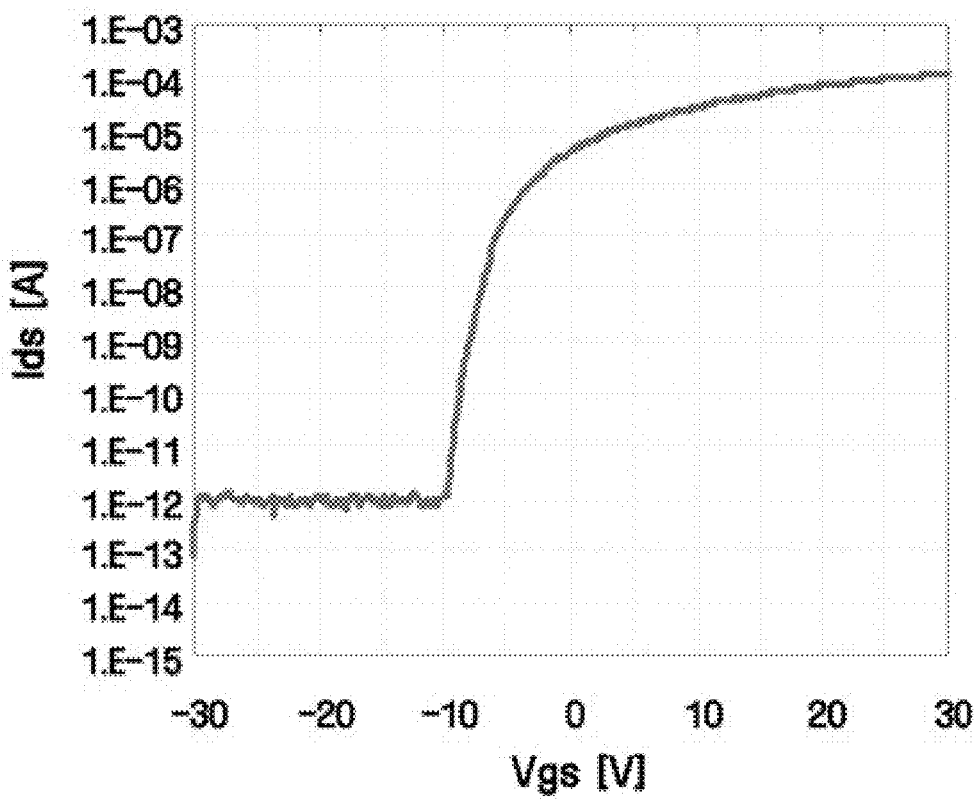
Figure 6:
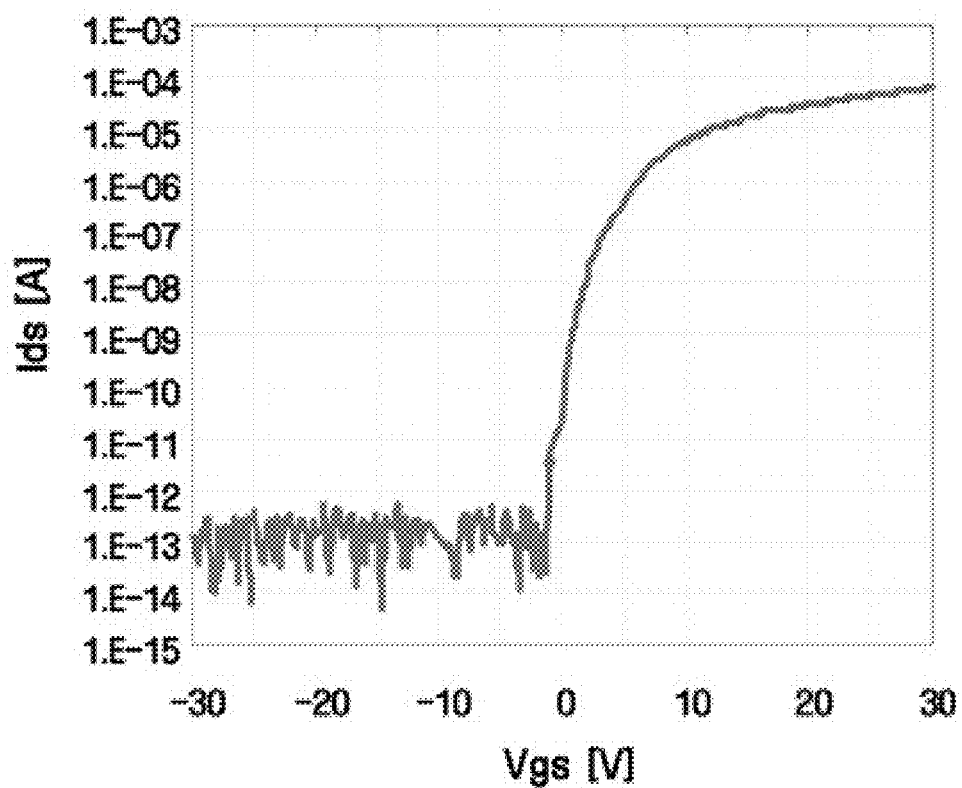
Figure 7:
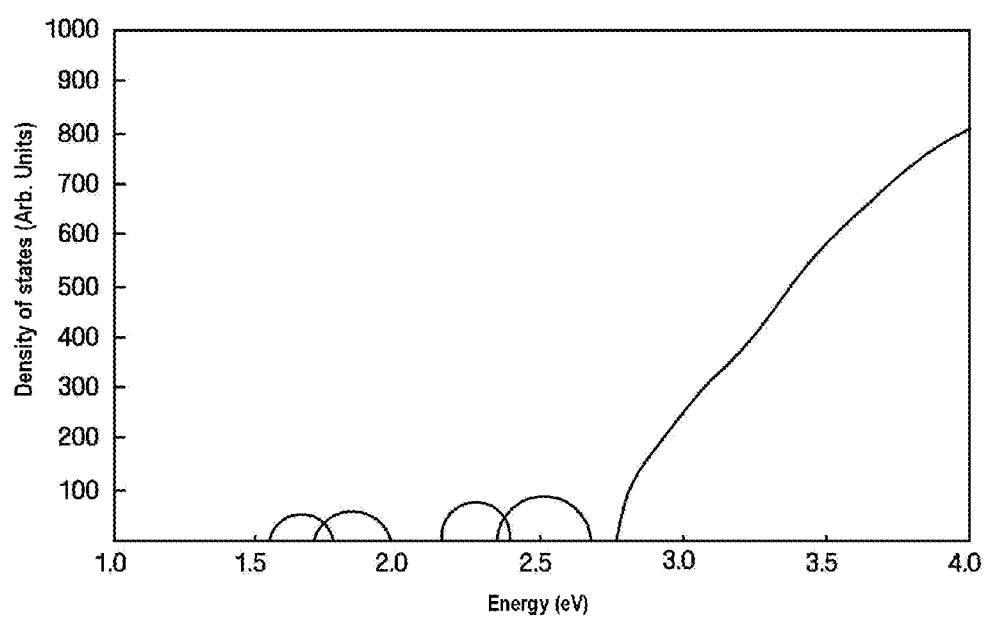
Figure 8:
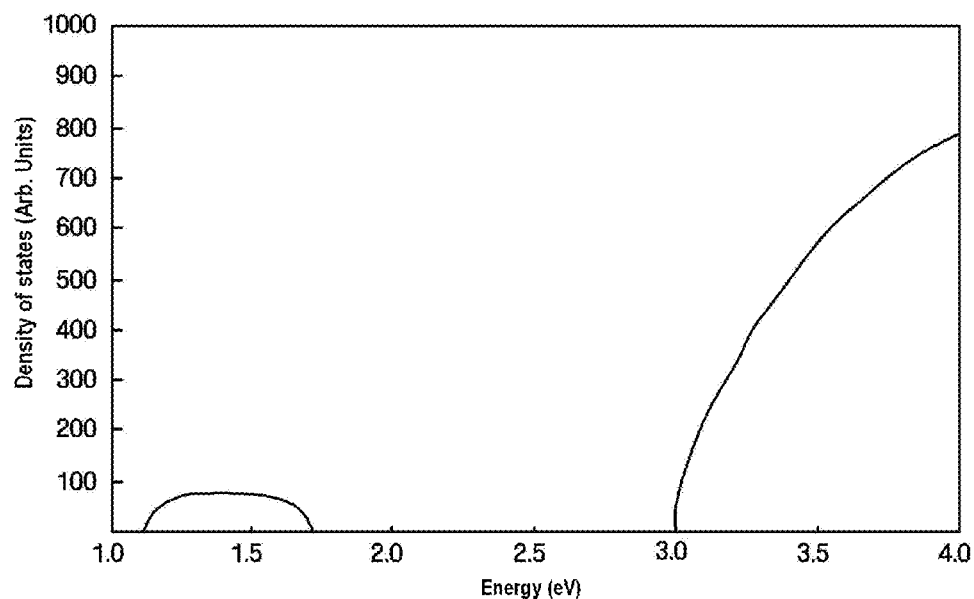

FIG. 1 is a layout of a display substrate according to an exemplary embodiment of the present invention. FIG. 2 is a cross-sectional view of a display device taken along line II-II' of FIG. 1. FIG. 3, FIG. 5, and FIG. 7 are graphs of characteristics of a thin film transistor in a comparative example of a display device. FIG. 4, FIG. 6, and FIG. 8 are graphs of characteristics of a thin film transistor of a display substrate according to an exemplary embodiment of the present invention.

Referring to FIG. 1 and FIG. 2, the display device 1 according to an exemplary embodiment of the present invention includes a first display substrate 100, a second display substrate 200, and a liquid crystal layer 300 interposed therebetween. FIG. 1 shows the layout of the first display substrate 100 according to the present exemplary embodiment.

First, the first display substrate 100 is described. On an insulating substrate 10, a gate line 22 is formed in a horizontal direction, and a gate electrode 26 of a thin film transistor TR1 connected to the gate line 22 protrudes from the gate line 22 in a rectangular shape. The gate line 22 and the gate electrode 26 are referred to as a gate wire.

Additionally, on the insulating substrate 10, a storage electrode line 28 is formed across a pixel region in the horizontal direction substantially parallel to the gate line 22, and a storage electrode 27 having a large width is connected to the storage electrode line 28. The storage electrode 27 overlaps with a drain electrode extension 67 connected to a pixel electrode 82, which will be described later, forming a storage capacitor to improve the charge storage capacity of a pixel. The storage electrode 27 and the storage electrode line 28 are referred to as a storage wire.

The shape and arrangement of the storage wire 27 and 28 may be modified in various ways. Further, storage capacitance may be generated by overlapping the pixel electrode 82 and the gate line 22 so that the storage wire 27 and 28 may be omitted.

The gate wire 22 and 26 and the storage wire 27 and 28 may be formed from aluminum-based metals such as aluminum (Al) and an aluminum alloy, silver-based metals such as silver (Ag) and a silver alloy, copper-based metals such as copper (Cu) and a copper alloy, molybdenum-based metals such as molybdenum (Mo) and a molybdenum alloy, manganese-based metals such as manganese (Mn) and a manganese alloy, chromium (Cr), titanium (Ti), tantalum (Ta), or the like and combinations thereof. Further, the gate wire 22 and 26, the storage electrode 27, and the storage electrode line 28 may have a multilayer structure including two conductive films (not shown) that may have different physical properties. A first conductive films may be a low resistivity metal, e.g., an aluminum-based metal, a silver-based metal and a copper-based metal, to reduce signal delay or voltage drop of the gate wire 22 and 26, the storage electrode 27, and the storage electrode line 28. On the other hand, the other conductive films in the multilayer structure may be formed of a different material than the first conductive material, e.g., a molybdenum-based metal, Cr, Ti, Ta, or the like and combinations thereof, having excellent contact characteristics with, e.g., zinc oxide (ZnO), indium tin oxide (ITO), and indium zinc oxide (IZO). Examples of such combinations may include a structure having a lower film of Cr and an upper film of Al, a lower film of Al and an upper film of Mo, a lower film of a copper-manganese (CuMn) alloy and an upper film of Cu, a lower film of Ti and an upper film of Cu, and the like. However, the present invention is not limited thereto, and the gate wire 22 and 26 and the storage wire 27 and 28 may be formed of various metals and conductors.

A gate insulating film 30 may be formed on the substrate 10, the gate wire 22 and 26, and the storage wire 27 and 28. For example, the gate insulating film 30 may contain silicon oxide (SiOx), silicon nitride (SiNx), or the like.

The gate insulating film 30 may have a bi-layer structure (not shown) including a SiNx layer and a SiOx layer. In this case, the SiNx layer is formed on the gate wire 22 and 26 and the storage wire 27 and 28. The SiOx layer is formed on the SiNx layer to be in contact with an oxide semiconductor pattern to be described below. Alternatively, in other exemplary embodiments, the gate insulating film 30 may have a single layer of silicon oxynitride (SiON), and the SiON layer may have an oxygen concentration distribution varying in a lamination direction, i.e., the oxygen concentration may change across the gate insulating film 30 in a vertical direction. In this case, the oxygen concentration may be higher in regions of the gate insulating film 30 that are proximal to an oxide semiconductor pattern 42 as compared with portions of the gate insulating film 30 that are proximal to the insulating substrate 10.

The oxide semiconductor pattern 42 is formed on the insulating substrate 10. The oxide semiconductor pattern 42 may contain a metal oxide and an element belonging to a group from the periodic table that is higher than the group to which the metal (of the metal oxide) belongs. For example, the element may belong to Groups III, IV, V, VI, or VII. Although the element may be nitrogen (N), phosphorus (P), fluorine (F), and chlorine (Cl), the element is not so limited.

The metal oxide may contain one or more metals, examples of which include zinc (Zn), indium (In), gallium (Ga), tin (Sn), hafnium (Hf), and tantalum (Ta). However, the metal oxide is not limited to these metals. With regard to these metals, the metal oxide may contain a compound such as InZnO, InGaO, InSnO, ZnSnO, GaSnO, GaZnO, GaZnSnO, GaInZnO, HfInZnO, $Ta_2O_5$, and ZnO.

If the element is, e.g., N, the oxide semiconductor pattern 42 may contain a material such as InZnON, InGaON, InSnON, ZnSnON, GaSnON, GaZnON, GaZnSnON, GaInZnON, HfInZnON, $Ta_2O_5N$, and ZnON. That is, the oxide semiconductor pattern 42 may include a metal oxynitride semiconductor.

The oxide semiconductor pattern 42 may be heat- or plasma-treated. If the oxide semiconductor pattern 42 undergoes heat or plasma treatment, the mobility and carrier number density of the oxide semiconductor pattern 42 may increase. On the other hand, if the oxide semiconductor pattern 42 is subjected to heat or plasma treatment, the sheet resistance Rs of the oxide semiconductor pattern 42 may decrease.

If the oxide semiconductor pattern 42 includes a metal oxynitride semiconductor that is heat- or plasma-treated, the post-treated metal oxynitride semiconductor may have a carrier number density ranging from $10^{16}/cm^3$ to $10^{19}/cm^3$. The metal oxynitride semiconductor may undergo heat treatment at a temperature of 250° C. Alternatively, the metal oxynitride semiconductor may be plasma-treated for 10 to 60 seconds in an $H_2$ gas environment, in a temperature range of 250° C.-450° C., and at a pressure ranging from 1000 mTorr to 3000 mTorr. Accordingly, the oxide semiconductor pattern 42 may also have a carrier number density ranging from $10^{16}/cm^3$ to $10^{19}/cm^3$. If the carrier number density of the oxide semiconductor pattern 42 is smaller than $10^{16}/cm^3$, the oxide semiconductor pattern 42 may more strongly exhibit electrically nonconductive (i.e., insulating) characteristics, making maintenance of semiconductor characteristics more difficult. On the other hand, if the carrier number density of the oxide semiconductor pattern 42 is greater than $10^{19}/cm^3$, the oxide semiconductor pattern 42 may more strongly exhibit electrically conductive characteristics, which also may make maintaining semiconductor characteristics difficult.

The metal oxynitride may include at least one metal of gallium, indium, zinc, tin, hafnium, and tantalum. That is, the metal oxynitride may include only one of gallium, indium, zinc, tin, hafnium, and tantalum. Alternatively, the metal oxynitride may include any combination of two or more of gallium, indium, zinc, tin, hafnium, and tantalum.

If the metal oxynitride semiconductor included in the oxide semiconductor pattern 42 has undergone a heat or plasma treatment, the metal oxynitride semiconductor may have an electron mobility greater than or equal to 10 $cm^2/V·s$. If the electron mobility of the oxide semiconductor pattern 42 is smaller than 10 $cm^2/V·s$, carrier movement may be restricted in the metal oxynitride semiconductor. As a result, the metal oxynitride semiconductor in the oxide semiconductor pattern 42 may exhibit poor semiconductor characteristics.

If the metal oxynitride semiconductor in the oxide semiconductor pattern 42 has undergone a heat or plasma treatment, the metal oxynitride semiconductor may have a sheet resistance Rs ranging from $10^5$ Ω/sq to $10^7$ Ω/sq. Accordingly, the oxide semiconductor pattern 42 may also have sheet resistance Rs ranging from $10^5$ Ω/sq to $10^7$ Ω/sq. In this case, if the sheet resistance Rs of the oxide semiconductor pattern 42 is smaller than $10^5$ Ω/sq, the oxide semiconductor pattern 42 may have sheet resistance Rs characteristic of a conductor rather than a semiconductor. If the sheet resistance Rs of the oxide semiconductor pattern 42 is greater than $10^7$ Ω/sq, the oxide semiconductor pattern 42 may have sheet resistance Rs characteristic of an insulator rather than a semiconductor.

As described above, since the oxide semiconductor pattern 42 of the thin film transistor TR1 may include a metal oxynitride semiconductor that has undergone a heat or plasma treatment, the characteristics of the thin film transistor TR1 may be improved. The characteristics of the thin film transistor TR1 according to an exemplary embodiment of the present invention are described below. The oxide semiconductor pattern 42 may be similar to or different from the pattern of a data wire 62, 65, 66, and 67 that is described below. That is, the oxide semiconductor pattern 42 may overlap the gate electrode 26, a source electrode 65, and a drain electrode 66. Accordingly, the oxide semiconductor pattern 42 may have a rectangular shape. Further, the oxide semiconductor pattern 42 may have a linear shape that is substantially identical to the shape of the data wire 62, 65, 66, and 67 except for the channel region of the thin film transistor.

The data wire 62, 65, 66, and 67 may be formed on the oxide semiconductor pattern 42 and the gate insulating film 30. The data wire 62, 65, 66, and 67 may include a data line 62 formed, e.g., in a vertical direction, to cross the gate line 22, thereby defining a pixel. The source electrode 65 branches from the data line 62 and extends on top of the oxide semiconductor layer 42. The drain electrode 66 is separate from the source electrode 66 and is formed on the oxide semiconductor layer 42 to face the source electrode 65 above the gate electrode 26. A channel region of the thin film transistor is formed in the oxide semiconductor layer 42 between the gate electrode 26, the source electrode 65, and the drain electrode 66, and the drain electrode extension 67 extends from the drain electrode 66 toward the storage electrode 27 and has a large area overlapping the storage electrode 27.

The data wire 62, 65, 66, and 67 may directly contact the oxide semiconductor pattern 42 (although not shown in FIG. 2) to form an ohmic contact. To form the ohmic contact, the data wire 62, 65, 66, and 67 may have a single layer or multilayer structure containing Ni, Co, Ti, Ag, Cu, Mo, Al, Be, Nb, Au, Fe, Se, Mn, or Ta. As examples of the multilayer structure, a double layer structure may include Ti/Al, Ta/Al, Ni/Al, Co/Al, Mo (or Mo alloy)/Cu, Mo (or Mo alloy)/Cu, Ti (or Ti alloy)/Cu, TiN (or TiN alloy)/Cu, Ta (or Ta alloy)/Cu, TiOx/Cu, Al/Nd, Mo/Nb, Mn (or Mn alloy)/Cu, or the like; and a triple layer structure may include Ti/Al/Ti, Ta/Al/Ta, Ti/Al/TiN, Ta/Al/TaN, Ni/Al/Ni, Co/Al/Co or the like. However, a material of the data wire 62, 65, 66, and 67 is not limited to these materials. Alternatively, as shown in FIG. 2, the data wire 62, 65, 66, and 67 may not directly contact the oxide semiconductor pattern 42, and an ohmic contact layer 46 may be interposed between the oxide semiconductor pattern 42 and the data wire 62, 65, 66, and 67. The ohmic contact layer 46 is described below.

The source electrode 65 at least partially overlaps the gate electrode 26. The drain electrode 66 at least partially overlaps gate electrode 26 and faces the source electrode 65. The gate electrode 26, the oxide semiconductor pattern 42, the drain electrode 66, and the source electrode 65 may form the thin film transistor TR1.

The drain electrode extension 67 overlaps the storage electrode 27, forming a storage capacitor. The gate insulating film 30 is interposed between the drain electrode extension 67 and the storage electrode 27. If the storage electrode 27 is not formed, the drain electrode extension 67 may be omitted.

A passivation film 70 may be formed on the gate data wire 62, 65, 66, and 67; the oxide semiconductor pattern 42; and the gate insulating film 30. For example, the passivation film 70 may be include an inorganic material such as silicon nitride, silicon oxide, or the like; an organic material having excellent planarization characteristics and photosensitivity; or a low-k insulating material formed by plasma enhanced chemical vapor deposition (PECVD), e.g., a-Si:C:O and a-Si:O:F.

The passivation film 70 may have a multilayer structure containing silicon oxide and silicon nitride. A silicon oxide layer may be formed on the oxide semiconductor pattern 42, and a silicon nitride layer may be formed on the silicon oxide layer. Since the oxide semiconductor pattern 42 is arranged adjacent to the silicon oxide layer, degradation of the thin film transistor TR1 may be prevented.

A contact hole 77 is formed on the passivation film 70 to expose the drain electrode extension 67.

The pixel electrode 82 is formed on the passivation film 70 along the border of a pixel. The pixel electrode 82 is electrically connected to the drain electrode extension 67 through the contact hole 77. In this case, the pixel electrode 82 may be formed from a transparent conductor such as ITO or IZO or a reflective conductor such as Al.

Next, a second display substrate 200 is described. A black matrix 220 for preventing leakage of light is formed on an insulating substrate 210. The black matrix 220 is not formed in a region corresponding to the pixel electrode 82, thereby defining a pixel region. The black matrix 220 may be formed from an opaque inorganic material or an opaque metal.

A color filter 230 for representing colors is formed on the insulating substrate 210. The color filter 230 may include red, green, and blue color filters to represent colors. The color filter 230 may display red, green, and blue colors by absorbing or transmitting light through red, green, and blue pigments that may be included in the respective color filter 230. In this case, the color filter 230 displays various colors by additive color mixture of the transmitted red, green, and blue light.

An overcoat 240 is formed on the black matrix 220 and the color filter 230 to reduce height differences therebetween. The overcoat 240 may be formed from a transparent organic material to protect the color filter 320 and the black matrix 220 and provide insulation from a common electrode 250.

The common electrode 250 may be formed on the overcoat 240. The common electrode 250 may be formed from a transparent conductive material, e.g., ITO, IZO, zinc oxide (ZnO), or the like.

The liquid crystal layer 300 may be interposed between the first display substrate 100 and the second display substrate 200. Light transmittance of the liquid crystal layer 300 may be effectively adjusted by a voltage difference between the pixel electrode 82 and the common electrode 250.

Characteristics of the thin film transistor TR1 are described below with reference to FIG. 3, FIG. 4, FIG. 5, FIG. 6, FIG. 7, and FIG. 8.

FIG. 3 and FIG. 4 are graphs of data for drain-source current Ids (in units of amperes A) as a function of gate voltage Vg (in units of volts V), which were measured for a gate voltage Vg applied to the gate electrode 26 over a test time period. The test time periods are indicated by the legend on the right-hand side of the graph. FIG. 3 includes data for comparative examples (labeled as a, b, c, d, and e) of a thin film transistor having an active layer containing untreated GaInZnON (i.e., has not been heat- or plasma-treated). FIG. 4 includes data for the thin film transistor TR1 of the first display substrate 100 according to an exemplary embodiment of the present invention. The oxide semiconductor pattern of the thin film transistor according to the exemplary embodiment of the present invention, which was used to collect the data shown in FIG. 4, contains GaInZnON that has been plasma-treated in an atmosphere of hydrogen ($H_2$) gas.

First, referring to FIG. 3 where the thin film transistor contains untreated GaInZnON, when the drain-source current Ids is 1 nA, the gate voltage (turn-on voltage) shifts according to the test time period. Specifically, the absolute difference between the turn-on voltages for test time periods of 0 s and 7200 s is about 8 V.

Next, referring to FIG. 4 where the thin film transistor TR1 according to the exemplary embodiment having the oxide semiconductor pattern 42 containing GaInZnON that has been plasma-treated in an atmosphere of hydrogen ($H_2$) gas, the turn-on voltage is shifted by a smaller amount compared to comparative examples shown in FIG. 3. Specifically, the absolute difference between the turn-on voltages for test time periods of 0 s and 7200 s is about 0.5 V. In other words, as shown in FIG. 4, for the thin film transistor TR1 of an exemplary embodiment of the present invention, the absolute difference of turn-on voltages for the gate electrode 26 between an initial turn-on (0 s) and a subsequent turn-on (e.g., data for 1800 s, 3600 s, 5400 s, and 7200 s) may be about 3 V or less.

Referring to FIG. 3 and FIG. 4, the thin film transistor in which the oxide semiconductor pattern 42 contains GaInZnON (plasma-treated in an atmosphere of $H_2$ gas) has a turn-on voltage shift that is less than that for an active layer containing untreated GaInZnON. Accordingly, the former may have excellent stability compared to the latter, as illustrated by the nearly overlaid solid lines for the different time data shown in FIG. 4.

FIG. 5 and FIG. 6 are graphs of data for drain-source current Ids (in units of amperes A) and gate voltage Vg (in units of volts V), which were measured as a function of the gate voltage Vg applied to the gate electrode 26. FIG. 5 contains data for a comparative example showing test results of a thin film transistor in which an active layer contains GaInZnON that has not been plasma-treated in an atmosphere of hydrogen ($H_2$) gas (i.e., is untreated). FIG. 6 includes data for the thin film transistor TR1 according to an exemplary embodiment of the present invention.

By comparison of the turn-on voltages in FIG. 5 and FIG. 6, the thin film transistor having an active layer containing untreated GaInZnON turns on at about −8 V (see FIG. 5). In contrast, the thin film transistor TR1 of the first display substrate 100 according to the exemplary embodiment of the present invention turns on at about 0 V or more (see FIG. 6).

Accordingly, the thin film transistor TR1 of the first display substrate 100 according to the exemplary embodiment of the present invention may have a turn-on voltage value that is shifted in a positive voltage direction with respect to a thin film transistor that has not been treated according to exemplary embodiments of the present invention. Thus, a voltage range and power consumption for operating the thin film transistor according to exemplary embodiments of the present invention may be reduced.

FIG. 7 is a graph showing the band gap of an active layer of a thin film transistor in a comparative example. FIG. 8 is a graph showing the band gap of the oxide semiconductor pattern 42 of the thin film transistor TR1 of the first display substrate 100 according to the exemplary embodiment of the present invention. In this case, the active layer included in the thin film transistor of the comparative example contains GaInZnON that has not been plasma-treated in an atmosphere of $H_2$ gas.

As shown in FIG. 7 and FIG. 8, the band gap of the oxide semiconductor pattern 42 of the thin film transistor TR1 of the first display substrate 100 according to the exemplary embodiment of the present invention (FIG. 8) is greater than the band gap of the active layer of the thin film transistor in the comparative example (FIG. 7). For example, the band gap of the oxide semiconductor pattern 42 of the thin film transistor TR1 of the first display substrate 100 according to the exemplary embodiment of the present invention is greater than 1 eV, but the band gap of the active layer of the thin film transistor in the comparative example is less than 0.5 eV.

Since the band gap of the oxide semiconductor pattern 42 of the thin film transistor TR1 of the first display substrate 100 according to the exemplary embodiment of the present invention becomes larger than the band gap of the active layer of the thin film transistor of the comparative example, an absolute value of the turn-off voltage of the thin film transistor TR1 of the first display substrate 100 according to the exemplary embodiment of the present invention generally may be reduced. As a result, although the operation of the display substrate is continued, the absolute value of the turn-off voltage of the thin film transistor TR1 of the first display substrate 100 according to the exemplary embodiment of the present invention may be prevented from increasing as the operation time increases. Further, leakage current between the source electrode 65 and the drain electrode 66 may be prevented.

Next, a method of manufacturing a display substrate according to an exemplary embodiment of the present invention will be described with reference to FIG. 1, FIG. 2, and FIG. 9, FIG. 10, FIG. 11, FIG. 12, FIG. 13, FIG. 14, and FIG. 15. For simplicity, components having substantially similar function as components of the previous exemplary embodiment are designated by the same reference numerals, and repeated descriptions thereof are abbreviated or omitted.

FIG. 9, FIG. 10, FIG. 11, FIG. 12, FIG. 13, FIG. 14, and FIG. 15 are cross-sectional views of a display substrate in sequential steps of a method of manufacturing the display substrate according to an exemplary embodiment of the present invention.

Figure 9:
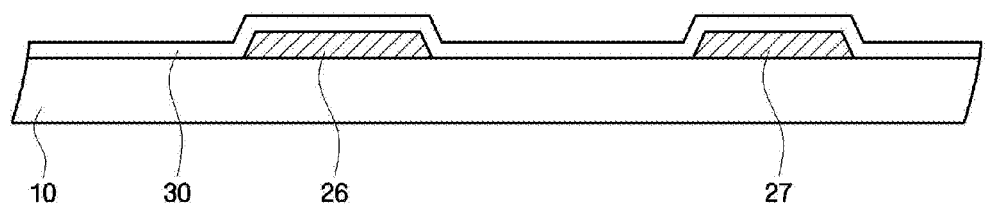
FIG. 9, FIG. 10, FIG. 11, FIG. 12, FIG. 13, FIG. 14, and FIG. 15 are cross-sectional views of a display substrate in sequential steps of a method of manufacturing the display substrate according to an exemplary embodiment of the present invention.
Figure 10:
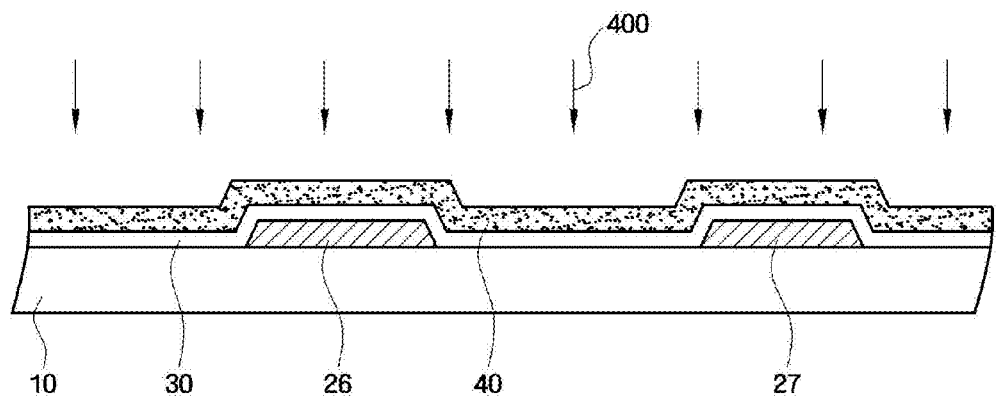
Figure 11:
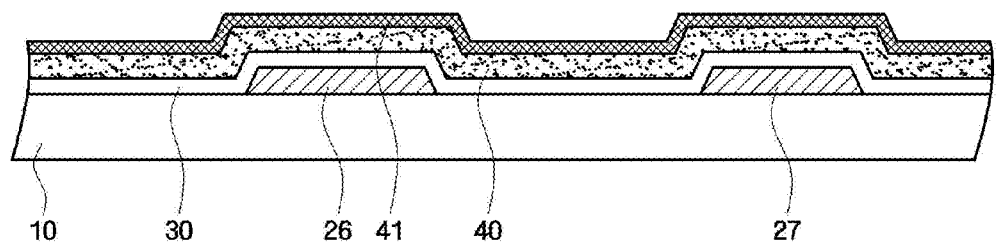
Figure 12:
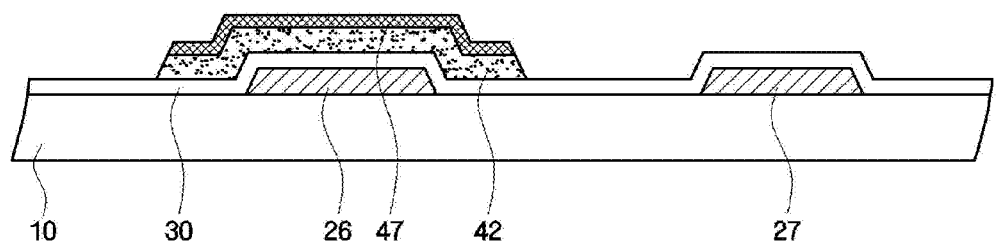

First, as shown in FIG. 9, after a multilayer or a single layer of metal film for a gate wire (not shown) is deposited on the insulating substrate 10, the metal film is patterned to form the gate line 22, the gate electrode 26, and the storage electrode 27.

The gate line 22, the gate electrode 26, and the storage electrode 27 may have a multilayer structure, e.g., a double layer structure, including a lower film of Al or an Al alloy and an upper film of Mo or a Mo alloy. The lower film and the upper film of the double layer structure may be deposited by a sputtering method. Further, wet or dry etching may be used when patterning metal film to produce the gate line 22, the gate electrode 26, and the storage electrode 27. For wet etching, an etching solution of phosphoric acid, nitric acid, acetic acid, or the like may be used. Further, in dry etching, a chlorine-based etching gas such as $Cl_2$ and $BCl_3$ may be used. In this case, when a multilayer metal film is etched anisotropically, the gate wire may be finely patterned.

Subsequently, the gate insulating film 30 is deposited on the insulating substrate 10, the gate wire 22 and 26, and the storage wire 27 and 28 by, e.g., plasma enhanced chemical vapor deposition (PECVD) or reactive sputtering.

Subsequently, an oxynitride compound is deposited by, e.g., reactive sputtering, to form the oxide semiconductor layer 40 on the gate insulating film 30. For example, the oxide semiconductor layer 40 may be formed by sputtering in a gas mixture containing argon (Ar), oxygen ($O_2$), and nitrogen ($N_2$).

Here, the amount of Ar may range from 90% to 93% of the gas content. If the amount of Ar is smaller than 90%, the carrier number density, the electron mobility, and the sheet resistance required for the oxide semiconductor layer 40 may not be characteristic of a semiconductor. That is, the oxide semiconductor layer 40 may have insulator characteristics. On the other hand, if the amount of Ar exceeds 90%, the oxide semiconductor layer 40 may have conductor characteristics rather than semiconductor characteristics.

Figure 16:
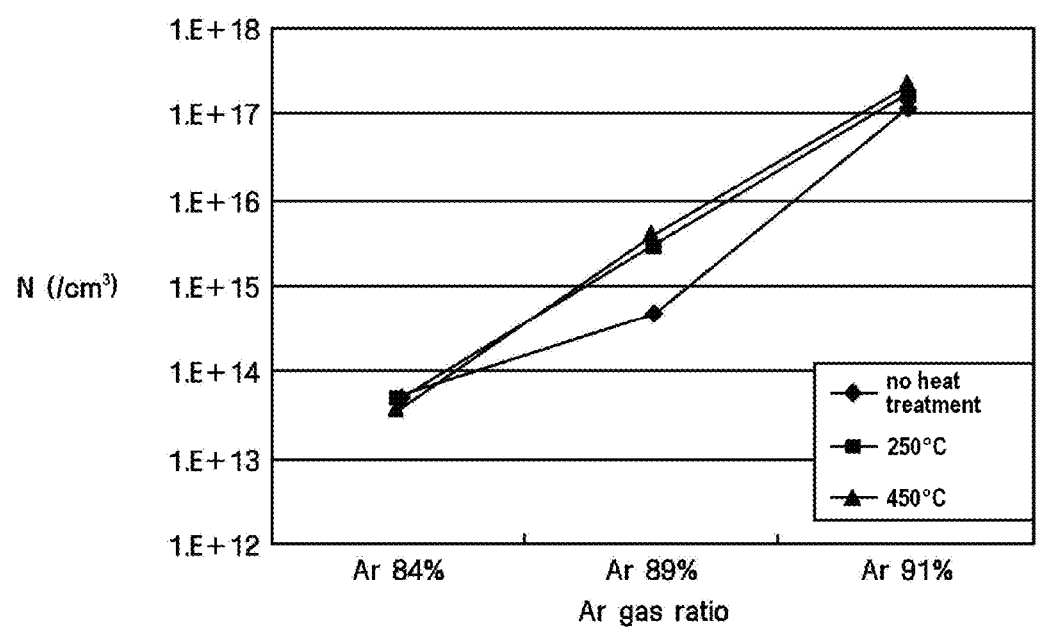
FIG. 16 is a graph showing the relationship between carrier number density N of a semiconductor layer and an Ar amount.
Figure 17:
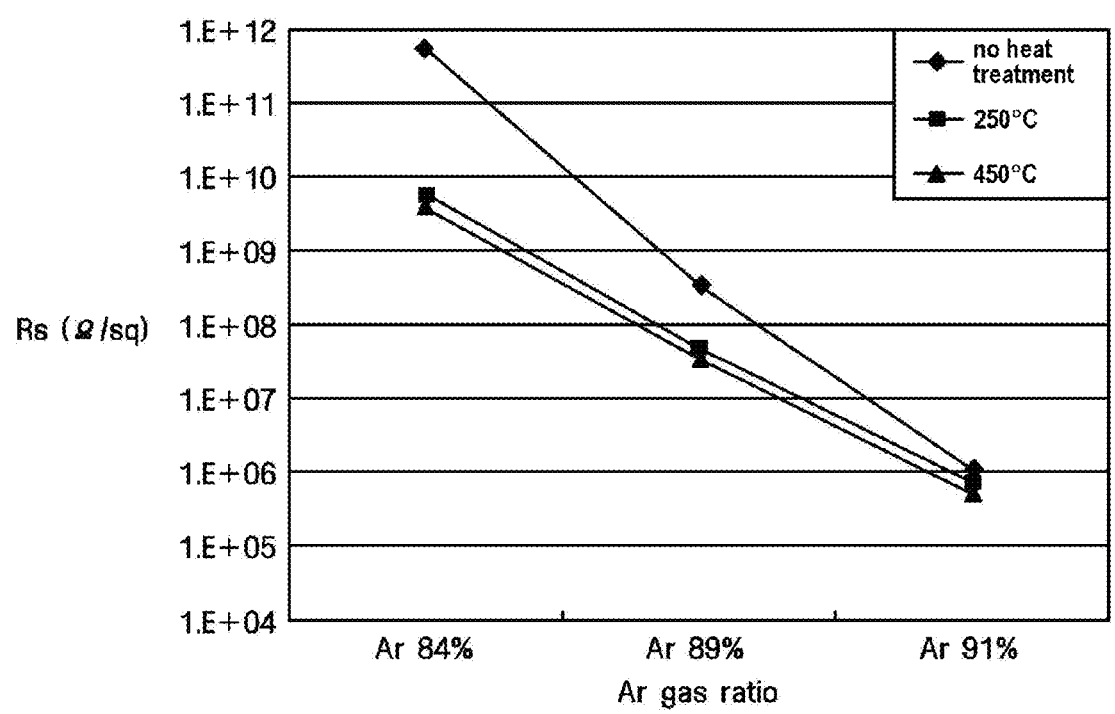
FIG. 17 is a graph showing the relationship between a sheet resistance of a semiconductor layer and an Ar amount.
Figure 18:
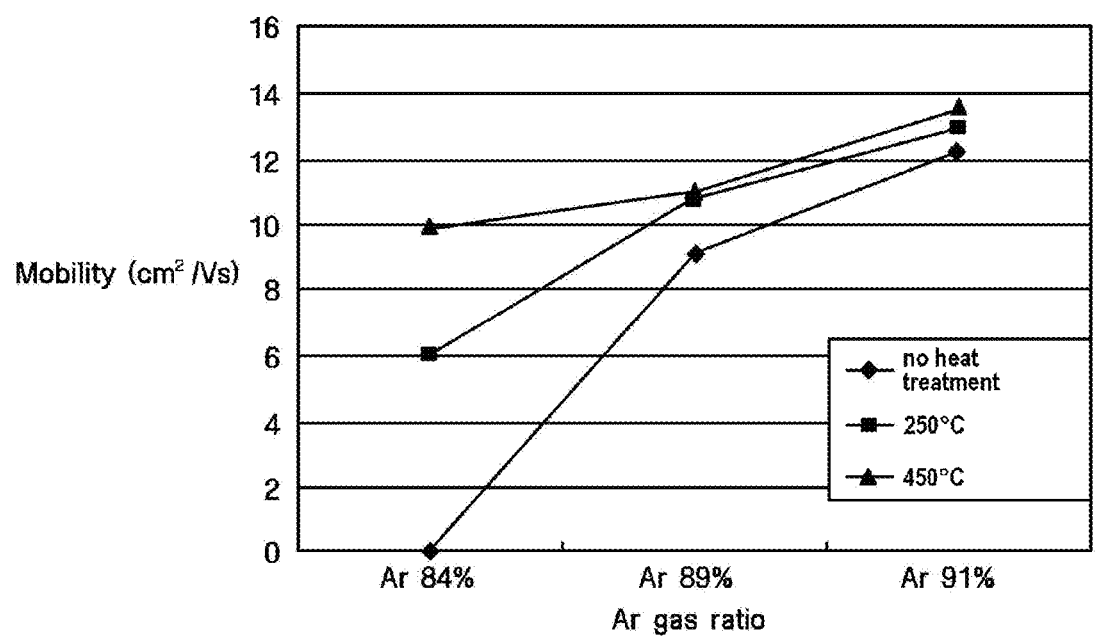
FIG. 18 is a graph showing the relationship between electron mobility of a semiconductor layer and an Ar amount.

Further description is provided with reference to FIG. 16, FIG. 17, and FIG. 18. FIG. 16 is a graph showing a relationship between a carrier number density N of the oxide semiconductor layer 40 as a function of an Ar amount. FIG. 17 is a graph showing a relationship between a sheet resistance Rs of the oxide semiconductor layer 40 and an Ar amount. FIG. 18 shows a relationship between an electron mobility of the oxide semiconductor layer 40 and an Ar amount. Referring to FIG. 16, FIG. 17, and FIG. 18, the carrier number density N, the sheet resistance Rs, and the electron mobility of the oxide semiconductor layer 40 are improved as the amount of Ar in the gas mixture used in sputtering increases.

The amount of $N_2$ may range from 5% to 6.5% of the gas mixture. If $N_2$ is less than 5%, the carrier number density N and the electron mobility of the oxide semiconductor layer 40 may be approximately those of a conductor, and ensuring the required semiconductor characteristics may be difficult. On the other hand, if $N_2$ exceeds 6.5%, the carrier number density N and the electron mobility of the oxide semiconductor layer 40 may be approximately those of an insulator.

Subsequently, the entire surface of the oxide semiconductor layer 40 may be plasma-treated in an $H_2$ gas environment. In this case, a portion of the oxide semiconductor layer 40, which will be formed into the oxide semiconductor pattern 42 in the following step, may be plasma-treated. In this case, the oxide semiconductor layer 40 may be plasma-treated by using a radio frequency (RF) power supply delivering power ranging from 0 $mW/cm^2 \cdot s$ to 600 $mW/cm^2 \cdot s$ at a pressure ranging from 1000 mTorr to 3000 mTorr. If the oxide semiconductor layer 40 is plasma-treated under conditions different from the above-mentioned conditions, the turn-on voltage of the thin film transistor TR1 of the first display substrate 100 according to the exemplary embodiment of the present invention may have various chemical distributions that exhibit various values of their electrical properties, thereby deteriorating the stability of the thin film transistor TR1. As an alternative to plasma treatment, the oxide semiconductor layer 40 may undergo a heat treatment.

The heat treatment may be performed in a temperature range from 250° C. to 450° C. Referring to FIG. 16, FIG. 17, and FIG. 18, the carrier number density N, the sheet resistance Rs, and the electron mobility of the oxide semiconductor layer 40 may be improved as a heat treatment temperature increases while increasing the amount of Ar. In FIG. 16, FIG. 17, and FIG. 18, t0 represents the characteristics of the oxide semiconductor layer 40 that has not undergone a heat treatment; t1 represents the characteristics of the oxide semiconductor layer 40 that has undergone a heat treatment at a temperature of 250° C., and t2 represents the characteristics of the oxide semiconductor layer 40 that has undergone a heat treatment at a temperature of 450° C.

If the heat treatment temperature of the oxide semiconductor layer 40 is lower than 250° C., it is difficult to ensure the characteristics of carrier number density N, the sheet resistance Rs, and the electron mobility for the oxide semiconductor layer 40 remain similar to a semiconductor. On the other hand, if the heat treatment temperature of the oxide semiconductor layer 40 exceeds 450° C., the characteristics of carrier number density N, the sheet resistance Rs, and the electron mobility required for the oxide semiconductor layer 40 may be semiconductive, but the cost of heat treatment increases. Subsequently, referring to FIG. 11 and FIG. 12, an ohmic contact conductive film 41 is sequentially deposited on the oxide semiconductor layer 40, e.g., by sputtering, and is patterned to form the oxide semiconductor pattern 42 and an ohmic contact conductive film pattern 47.

Figure 13:
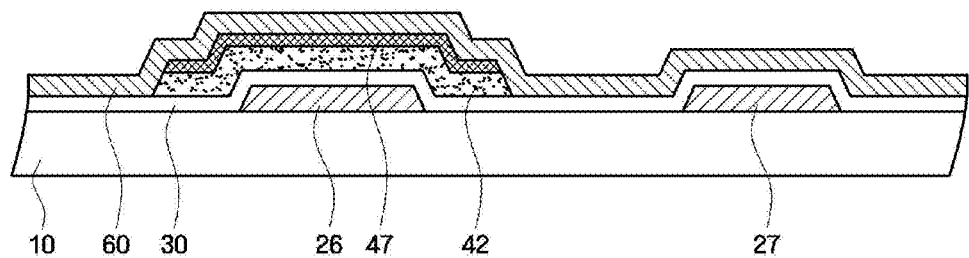
Figure 14:
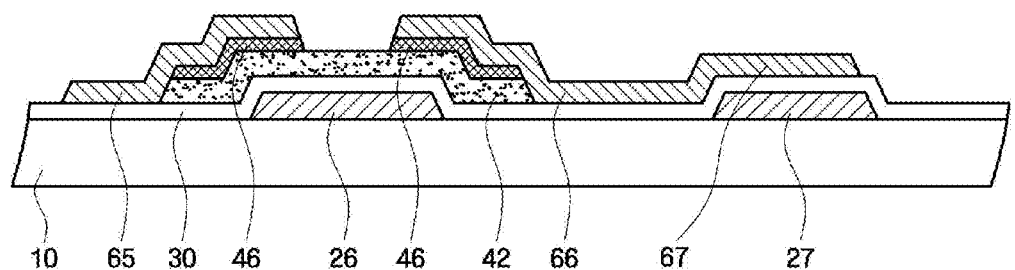

Subsequently, as shown in FIG. 13 and FIG. 14, a data wire conductive film 60 is deposited on the ohmic contact conductive film pattern 47 and the gate insulating film 30 by, e.g., sputtering and is patterned to form the data wire 62, 65, 66, and 67.

Then, the ohmic contact conductive film pattern 47 is etched back to form the ohmic contact layer 46 and expose a portion of the oxide semiconductor pattern 42. In this case, the surface of the exposed portion of the oxide semiconductor pattern 42 may be damaged.

Here, the oxide semiconductor pattern 42 may be formed from mixed oxides such as InZnON, InGaON, InSnON, ZnSnON, GaSnON, GaZnON, GaZnSnON, GaInZnON, HfInZnON, and ZnON. The ohmic contact layer 46 may be omitted. It is preferable that the data wire 62, 65, 66, and 67 is formed from a metal material having a work function lower than that of the oxide semiconductor pattern 42. For example, the data wire 62, 65, 66, and 67 preferably has a single layer or multilayer structure containing Ni, Co, Ti, Ag, Cu, Mo, Al, Be, Nb, Au, Fe, Se, Ta, or the like. Examples of the multilayer structure include a double layer structure of Ti/Al, Ta/Al, Ni/Al, Co/Al, Mo(Mo alloy)/Cu, Mo(Mo alloy)/Cu, or the like and a triple layer structure of Ti/Al/Ti, Ta/Al/Ta, Ti/Al/TiN, Ta/Al/TaN, Ni/Al/Ni, Co/Al/Co, or the like.

Figure 15:
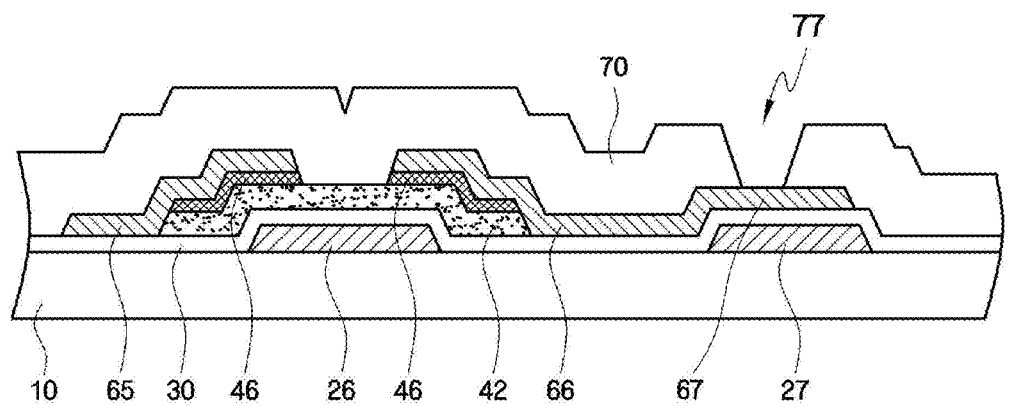

Subsequently, as shown in FIG. 15, the passivation film 70 is formed on the resultant structure. Then, as shown in FIG. 15, the passivation film 70 is etched by photolithography to form the contact hole 77 exposing the drain electrode extension 67.

Finally, as in the first display substrate 100 shown in FIG. 2, a transparent conductor such as ITO and IZO or a reflective conductor is deposited and etched to form the pixel electrode 82 connected to the drain electrode extension portion 67.

Although a process for forming the first display substrate 100 by a five-sheet mask process is exemplified in the above exemplary embodiments, it is not limited thereto and the first display substrate 100 may be formed by a four-sheet mask process.

The method of manufacturing a display substrate according to exemplary embodiments of the present invention may also be applied to a color filter on array (COA) structure for forming color filters on a thin film transistor array in addition to the above exemplary embodiments.

While the present invention has been described with reference to exemplary embodiments, it will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A display substrate, comprising:
    a gate wire disposed on a substrate;
    a semiconductor pattern disposed on the gate wire and comprising a metal oxynitride semiconductor that is plasma treated in a hydrogen ($H_2$) gas atmosphere, so as to have a sheet resistance ranging from $10^5$ Ω/sq to $10^7$ Ω/sq; and
    a data wire disposed on the semiconductor pattern and crossing the gate wire.

2. The display substrate of claim 1, wherein the semiconductor pattern has a carrier number density ranging from $10^{16}/cm^3$ to $10^{19}/cm^3$.

3. The display substrate of claim 2, wherein the metal oxynitride comprises at least one metal of gallium (Ga), indium (In), zinc (Zn), tin (Sn), hafnium (Hf), and tantalum (Ta).

4. The display substrate of claim 3, wherein the metal oxynitride is GaInZnON or HfInZnON.

5. The display substrate of claim 2, wherein a band gap of the semiconductor pattern is greater than or equal to 3.0 eV.

6. The display substrate of claim 2, wherein the gate wire comprises a gate electrode;
    wherein a thin film transistor of the display substrate comprises a portion of each of the data wire, the semiconductor pattern, and the gate electrode; and
    the thin film transistor turns on when a voltage applied to the gate electrode is greater than or equal to 0 V.

7. The display substrate of claim 2, wherein the gate wire comprises a gate electrode;
    wherein a thin film transistor of the display substrate comprises a portion of each of the data wire, the semiconductor pattern, and the gate electrode;
    the thin film transistor has a first turn on voltage corresponding to a first voltage applied to the gate electrode and has a subsequent turn on voltage corresponding to a second voltage applied to the gate electrode; and
    the absolute value of the difference between the first voltage and the second voltage is less than or equal to 3 V.

8. The display substrate of claim 2, wherein the semiconductor pattern has an electron mobility greater than or equal to 10 $cm^2/V·s$.

9. The method of claim 8, wherein the plasma treatment is performed using a radio frequency (RF) power ranging from 0 $mW/cm^2·s$ to 600 $mW/cm^2·s$.

10. A method of manufacturing a display substrate, the method comprising:
    forming a gate wire on a substrate;
    forming a semiconductor comprising a metal oxynitride on the gate wire;
    performing a plasma treatment on the semiconductor and in a hydrogen ($H_2$) gas atmosphere; and
    forming a data wire on the semiconductor, the date wire crossing the gate wire.

11. The method of claim 10, wherein the plasma treatment is performed on the semiconductor before forming the date wire.

12. The method of claim 10, wherein forming the semiconductor comprises:
    depositing a semiconductor layer; and
    patterning the semiconductor layer before the plasma treatment is performed.

13. The method of claim 10, wherein forming the semiconductor comprises:
    forming a semiconductor layer; and
    patterning the treated semiconductor layer after the plasma treatment is performed.

14. The method of claim 10, wherein forming the semiconductor comprises sputtering in the presence of a gas mixture comprising argon (Ar), nitrogen ($N_2$), and oxygen ($O_2$).

15. The method of claim 14, wherein the amount of Ar ranges from 90% to 93% of the gas mixture.

16. The method of claim 15, wherein the amount of $N_2$ ranges from 5% to 6.5% of the gas mixture.

17. The method of claim 10, wherein the plasma treatment is performed at a pressure ranging from 1000 mTorr to 3000 mTorr.

18. A microelectronic switch, comprising:
- a gate electrode;
- a drain electrode and a source electrode disposed corresponding to the gate electrode;
- a semiconductor disposed between the gate electrode and the drain electrode and the source electrode,
- wherein the semiconductor comprises a metal oxynitride that is plasma treated in a hydrogen ($H_2$) gas atmosphere and has a carrier number density such that the semiconductor has a sheet resistance ranging from $10^5$ Ω/sq to $10^7$ Ω/sq and an electron mobility greater than or equal to 10cm$^2$/V·s.

19. The microelectronic switch of claim 18, wherein the carrier number density ranges from $10^{16}$/cm$^3$ to $10^{19}$/cm$^3$.

20. The microelectronic switch of claim 18, wherein the metal oxynitride comprises at least one metal of gallium (Ga), indium (In), zinc (Zn), tin (Sn), hafnium (Hf), and tantalum (Ta).

21. The microelectronic switch of claim 20, wherein the metal oxynitride is GaInZnON or HfInZnON.

22. The microelectronic switch of claim 18, wherein the band gap of the semiconductor is greater than or equal to 3.0 eV.

* * * * *